(12) United States Patent
Nishizawa

(10) Patent No.: US 7,377,978 B2
(45) Date of Patent: May 27, 2008

(54) METHOD FOR PRODUCING SILICON EPITAXIAL WAFER AND SILICON EPITAXIAL WAFER

(75) Inventor: Tsuyoshi Nishizawa, Nishishirakawa-gun (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 6 days.

(21) Appl. No.: 10/561,957

(22) PCT Filed: Jun. 21, 2004

(86) PCT No.: PCT/JP2004/008725

§ 371 (c)(1),
(2), (4) Date: Dec. 22, 2005

(87) PCT Pub. No.: WO2005/001916

PCT Pub. Date: Jan. 6, 2005

(65) Prior Publication Data

US 2006/0201413 A1    Sep. 14, 2006

(30) Foreign Application Priority Data

Jun. 26, 2003    (JP) .............................. 2003-182615

(51) Int. Cl.
C30B 23/02 (2006.01)
C30B 25/02 (2006.01)
C30B 28/12 (2006.01)
C30B 28/18 (2006.01)

(52) U.S. Cl. .............................. 117/88; 117/89; 117/90; 117/94; 117/97; 117/98; 117/105; 117/106; 117/107

(58) Field of Classification Search ................ 438/455, 438/149, 155, 456, 156; 257/758; 117/84, 117/88, 89, 90, 94, 97, 98, 105, 106, 107
See application file for complete search history.

(56) References Cited

U.S. PATENT DOCUMENTS 6,593,211 B2 *   7/2003   Sato ........................... 438/455
2002/0022351 A1 *  2/2002   Schmolke et al. .......... 438/504

FOREIGN PATENT DOCUMENTS

| JP | A-08-236462 | 9/1996 |
| JP | A-09-205130 | 8/1997 |
| JP | A-11-016844 | 1/1999 |
| JP | A-2000-103696 | 4/2000 |
| JP | A-2003-532612 | 11/2003 |
| WO | WO 01/86035 A1 | 11/2001 |

* cited by examiner

Primary Examiner—Robert B. Davis
Assistant Examiner—Seyed Masoud Malekzadeh
(74) Attorney, Agent, or Firm—Oliff & Berridge, PLC

(57) ABSTRACT

It is to provide a method for producing a silicon epitaxial wafer, which can prevent fine unevenness from occurring on a rear main surface of a silicon epitaxial wafer and which suppresses the haze level of the whole rear main surface to 50 ppm or less.

A method for producing a silicon epitaxial wafer, includes: a hydrogen heat treatment step of arranging within a reactor a susceptor capable of mounting a silicon single crystal substrate and subjecting the silicon single crystal substrate mounted on the susceptor to heat treatment in a hydrogen atmosphere, and a vapor phase epitaxy step of epitaxially growing a silicon epitaxial layer after the hydrogen heat treatment step, wherein the silicon single crystal substrate is separated from the susceptor during the hydrogen heat treatment step, and the silicon single crystal substrate is mounted on the susceptor during the vapor phase epitaxy step.

9 Claims, 12 Drawing Sheets

☐ $0.1 \leq x \leq 0.2$

▨ $0.2 < x \leq 0.5$

▨ $0.5 < x \leq 50$

▨ $50 < x$

□  $0.1 \leq x \leq 0.2$

□  $0.1 \leq x \leq 0.2$

□  $0.1 \leq x \leq 0.2$
▒  $0.2 < x \leq 0.5$
▓  $0.5 < x \leq 50$
■  $50 < x$

☐ $0.1 \leq x \leq 0.2$
▨ $0.2 < x \leq 0.5$
■ $0.5 < x \leq 50$

☐ $0.1 \leq x \leq 0.2$
▨ $0.2 < x \leq 0.5$
■ $0.5 < x \leq 50$

☐ $0.1 \leq x \leq 0.2$
▨ $0.2 < x \leq 0.5$

☐ $0.1 \leq x \leq 0.2$

☐ $0.1 \leq x \leq 0.2$

☐ $0.1 \leq x \leq 0.2$
▩ $0.2 < x \leq 0.5$
▩ $0.5 < x \leq 50$
▩ $50 < x$

☐ $0.1 \leq x \leq 0.2$
▨ $0.2 < x \leq 0.5$

☐ $0.1 \leq x \leq 0.2$
▨ $0.2 < x \leq 0.5$
▩ $0.5 < x \leq 50$

☐ $0.1 \leq x \leq 0.2$
▨ $0.2 < x \leq 0.5$
▩ $0.5 < x \leq 50$
■ $50 < x$

☐ $0.1 \leq x \leq 0.2$

☐ $0.1 \leq x \leq 0.2$
▨ $0.2 < x \leq 0.5$
▦ $0.5 < x \leq 50$

☐ $0.1 \leq x \leq 0.2$
▨ $0.2 < x \leq 0.5$
▦ $0.5 < x \leq 50$

☐ $0.1 \leq x \leq 0.2$
▨ $0.2 < x \leq 0.5$
▦ $0.5 < x \leq 50$

- □ $0.1 \leq x \leq 0.2$
- ▨ $0.2 < x \leq 0.5$
- ▨ $0.5 < x \leq 50$
- ▪ $50 < x$

- □ $0.1 \leq x \leq 0.2$
- ▨ $0.2 < x \leq 0.5$
- ▨ $0.5 < x \leq 50$
- ▪ $50 < x$

- □ $0.1 \leq x \leq 0.2$
- ▨ $0.2 < x \leq 0.5$
- ▨ $0.5 < x \leq 50$
- ▪ $50 < x$

- □ $0.1 \leq x \leq 0.2$
- ▨ $0.2 < x \leq 0.5$
- ▨ $0.5 < x \leq 50$
- ▪ $50 < x$

METHOD FOR PRODUCING SILICON EPITAXIAL WAFER AND SILICON EPITAXIAL WAFER

TECHNICAL FIELD

The present invention relates to a method for producing a silicon epitaxial wafer. The present invention also relates to a silicon epitaxial wafer.

BACKGROUND ART

Conventionally, there is known a method for producing a silicon epitaxial wafer by epitaxially growing a silicon epitaxial layer on a front main surface of a silicon single crystal substrate mounted on a spot facing of a susceptor arranged within a reactor.

In a case of producing the silicon epitaxial wafer, a cleaning step of cleaning the silicon single crystal substrate is performed before vapor phase epitaxy of the silicon epitaxial layer. In the cleaning step, generally, an SC1 cleaning step of mainly removing particles is performed using a mixed solution composed of ammonia water and hydrogen peroxide solution and then, an SC2 cleaning step of mainly removing metals is performed using a mixed solution composed of hydrochloric acid and hydrogen peroxide solution. During the SC1 cleaning and the SC2 cleaning, a natural oxide film is formed on a surface of the silicon single crystal substrate.

Thereafter, the cleaned silicon single crystal substrate is carried within the reactor and mounted on the spot facing of the susceptor. Further, heating within the reactor is performed to subject the substrate to hydrogen heat treatment. As a result, the natural oxide film formed on the front main surface of the silicon single crystal substrate is removed by etching using a hydrogen gas. In the hydrogen heat treatment, a hydrochloric gas may be used together with a hydrogen gas.

Next, a temperature within the reactor is set to a growth temperature and a silicon source gas is fed on the front main surface of the silicon single crystal substrate. As a result, the silicon epitaxial layer is epitaxially grown on the front main surface of the silicon single crystal substrate. Thus, the silicon epitaxial wafer is produced.

Further, there is known a wafer supporting apparatus for forming a thin film on a rear surface of a wafer, in which projections for supporting the wafer from its lower surface are provided on tops of lift pins for forming a clearance between the wafer and a susceptor (see, e.g., Patent Document 1).

Patent Document 1: Japanese Patent Application Publication Unexamined Tokukaihei-9-205130

DISCLOSURE OF THE INVENTION

Problem to be Solved by the Invention

Incidentally, fine unevenness may be formed on a rear main surface of a silicon epitaxial wafer. Particularly, in a silicon epitaxial wafer produced by epitaxially growing a silicon epitaxial layer on a front main surface of a double-sided mirror silicon single crystal substrate of which both the main surfaces are subjected to a mirror polishing finish, the fine unevenness is observed as haze under a collimated light or by an optical surface inspection apparatus.

The present invention is made in order to solve the above-described problems. An object of the present invention is to provide a method for producing a silicon epitaxial wafer, which can prevent fine unevenness from occurring on a rear main surface of a silicon epitaxial wafer, particularly, a silicon epitaxial wafer produced by epitaxially growing a silicon epitaxial layer on a front main surface of a double-sided mirror silicon single crystal substrate and which can improve a haze level on the rear main surface of the silicon epitaxial wafer. Another object of the present invention is to provide a silicon epitaxial wafer which can be produced by the producing method.

Means for Solving the Problem

As described above, fine unevenness is formed, particularly, on the rear main surface of the silicon epitaxial wafer produced by epitaxially growing the silicon epitaxial layer on the front main surface of the double-sided mirror silicon single crystal substrate. It can be understood that the reason for the above is as follows.

In the production of the silicon epitaxial wafer, hydrogen heat treatment is performed before the vapor phase epitaxy of the silicon epitaxial layer as described above. During the hydrogen heat treatment, the front main surface of the silicon single crystal substrate is etched by a hydrogen gas as well as the hydrogen gas goes around to a clearance between an upper surface of a spot facing of a susceptor and a rear main surface of the silicon single crystal substrate housed in the spot facing, and as a result, a natural oxide film on the rear main surface of the silicon single crystal substrate is locally etched. Particularly in portions of the rear main surface facing lift pin through-holes formed on the susceptor, the natural oxide film is easily etched.

When epitaxially growing the silicon epitaxial layer in a state where the natural oxide film is thus etched locally to generate etching unevenness, the silicon epitaxial layer is epitaxially grown in spots on a place where silicon which constitutes the rear main surface of the silicon single crystal substrate is locally exposed, and as a result, fine unevenness is formed on the rear main surface.

Thus, a method for producing a silicon epitaxial wafer according to a first aspect of the present invention comprises a hydrogen heat treatment step of arranging a susceptor capable of mounting a silicon single crystal substrate within a reactor and subjecting the silicon single crystal substrate mounted on the susceptor to heat treatment in a hydrogen atmosphere; and a vapor phase epitaxy step of epitaxially growing a silicon epitaxial layer after the hydrogen heat treatment step, wherein the silicon single crystal substrate is separated from the susceptor during the hydrogen heat treatment step, and the silicon single crystal substrate is mounted on the susceptor during the vapor phase epitaxy step.

When the silicon single crystal substrate is separated from the susceptor by allowing a lift pin which vertically moves the silicon single crystal substrate relatively to the susceptor to support the silicon single crystal substrate, no exclusive separation device is required and therefore, this way is simple.

The hydrogen heat treatment step is preferably performed at a temperature lower than a vapor phase epitaxy temperature of the silicon epitaxial layer.

Further, in the hydrogen heat treatment step, a temperature within the reactor when the silicon single crystal substrate is separated from the susceptor is preferably at least 900° C. or more, more preferably 1000° C. or more. On the other hand, the temperature within the reactor is preferably less than 1150° C., more preferably 1100° C. or less.

Further, when the method comprises a cleaning step of cleaning the silicon single crystal substrate before the hydrogen heat treatment step, it is preferable that the cleaning step has rear main surface natural oxide film removal cleaning for removing a natural oxide film formed at least on the rear main surface of the silicon single crystal substrate, and the rear main surface natural oxide film removal cleaning is performed as final cleaning in the cleaning step.

Further, in this case, the cleaning step may have both main surfaces natural oxide film removal cleaning for removing a natural oxide film formed on both the main surfaces of the silicon single crystal substrate and the both main surfaces natural oxide film removal cleaning may be performed as final cleaning.

In these cases, it is preferable that in the natural oxide film removal cleaning, the natural oxide film is cleaned and removed using hydrofluoric acid.

On the other hand, it is preferable that the cleaning step has front main surface oxide film formation cleaning for forming an oxide film on the front main surface of the silicon single crystal substrate, and the front main surface oxide film formation cleaning is performed as final cleaning of the front main surface.

Further, it is preferable that a time for the silicon single crystal substrate to be stored in air during the period that the substrate is fed into the reactor after the final cleaning is set within 3 days.

A method for producing a silicon epitaxial wafer according to a second aspect of the present invention comprises: a cleaning step of cleaning a silicon single crystal substrate; and a vapor phase epitaxy step of mounting the silicon single crystal substrate on a susceptor arranged within a reactor with a non-oxidizing atmosphere and epitaxially growing a silicon epitaxial layer after the cleaning step, wherein in the cleaning step, front main surface oxide film formation cleaning for forming an oxide film on a front main surface of the silicon single crystal substrate is performed as final cleaning of the front main surface and rear main surface natural oxide film removal cleaning for removing a natural oxide film formed on a rear main surface of the silicon single crystal substrate is performed as final cleaning of the rear main surface.

When the rear main surface natural oxide film removal cleaning is performed as the final cleaning in the cleaning step, the time for the silicon single crystal substrate to be stored in air during the period that the substrate is fed into the reactor after the final cleaning is preferably set within 6 hours in order to prevent a natural oxide film formed during the period up to the subsequent vapor phase epitaxy from becoming thick.

Further, the silicon single crystal wafer is preferably a double-sided mirror silicon single crystal substrate of which both the main surfaces are subjected to a mirror polishing finish.

According to the method for producing a silicon epitaxial wafer in accordance with the first or second aspect of the present invention, a natural oxide film on the rear main surface of the silicon single crystal substrate, particularly, of the double-sided mirror silicon single crystal substrate can be evenly etched. Therefore, in the subsequent vapor phase epitaxy step, fine unevenness can be prevented from occurring on the rear main surface of the substrate, particularly, on the portions of the rear main surface facing the lift pin through-holes formed on the spot facing, so that no haze can be observed under a collimated light or by an optical surface inspection apparatus. As a result, there can be produced a silicon epitaxial wafer comprising:

a silicon single crystal substrate, particularly, a double-sided mirror silicon single crystal substrate of which both the main surfaces are subjected to a mirror polishing finish, and a silicon epitaxial layer formed on a front main surface of the substrate, wherein a haze level of the whole rear main surface is 0.1 ppm to 50 ppm, more preferably 0.1 ppm to 0.5 ppm.

When the haze level on the whole rear main surface is 50 ppm or less, no haze is detected by a visual inspection under a collimated light in a dark room. Further, when the haze level on the whole rear main surface is 0.5 ppm or less, particles having a diameter of 0.18 μm or more on the rear main surface can be measured using an optical surface inspection apparatus.

In the above description, ppm is a unit expressing an intensity of scattered light obtained by optically scanning the rear main surface of the silicon epitaxial wafer using an optical surface inspection apparatus such as a laser scattered light detection apparatus. In other words, for example, 0.1 ppm means that scattered light having an intensity of 0.1 millionth of an intensity of incident light is measured. Further, the intensity of scattered light is proportional to a size of surface roughness and therefore, for example, it is understood that when the intensity of the scattered light is large, unevenness is relatively large.

Incidentally, the laser scattered light detection apparatus can perform a measurement on the whole rear main surface of the silicon epitaxial wafer. However, at a peripheral edge of the silicon epitaxial wafer, a measurable level of diffuse reflection light from a chamfer of the wafer is simultaneously measured. Therefore, measured values obtained in a range of several millimeters in width at the peripheral edge of the silicon epitaxial wafer are normally excluded.

The silicon epitaxial wafer is particularly preferably a high flatness silicon epitaxial wafer having a diameter of 300 mm or more, which enjoys an increasing demand recently.

Herein, the wafer supporting apparatus in the above-described Patent Document 1 has a construction of always forming a clearance between the wafer and the susceptor in order to form a thin film on the rear surface of the wafer. In the present invention, in order to evenly etch the natural oxide film on the rear main surface of the silicon single crystal substrate, particularly, of the double-sided mirror silicon single crystal substrate, the substrate is separated from the susceptor in subjecting the substrate to hydrogen heat treatment. On the other hand, the substrate is mounted on the susceptor in epitaxially growing the silicon epitaxial layer on the front main surface of the double-sided mirror silicon single crystal substrate. In other words, there is used a construction such that the substrate and the susceptor are not separated from each other during the vapor phase epitaxy. In short, the object and construction of the present invention are different from those of the invention disclosed in the Patent Document 1. According to the present invention, the natural oxide film on the rear main surface of the substrate can be evenly etched before the vapor phase epitaxy as well as the silicon epitaxial layer can be prevented from being epitaxially grown in spots on the rear main surface of the substrate.

EFFECT OF THE INVENTION

According to the present invention, a natural oxide film on a rear main surface of a silicon single crystal substrate can be evenly etched. Therefore, in the subsequent vapor phase epitaxy step, fine unevenness can be prevented from occurring on the rear main surface of the substrate, particularly, on the portions of the rear main surface facing the lift pin through-holes, and as a result, a haze level of the whole rear main surface of the silicon epitaxial wafer can be suppressed to 50 ppm or less.

BEST MODE FOR CARRYING OUT THE INVENTION

Embodiments according to the present invention will be described below with reference to the accompanying drawings.

First Embodiment

First, a schematic construction of a single wafer vapor phase epitaxy apparatus 100 as one preferable example of a vapor phase epitaxy apparatus used in a method for producing a silicon epitaxial wafer according to a first embodiment to which the present invention is applied will be described with reference to FIG. 3.

Figure 3:
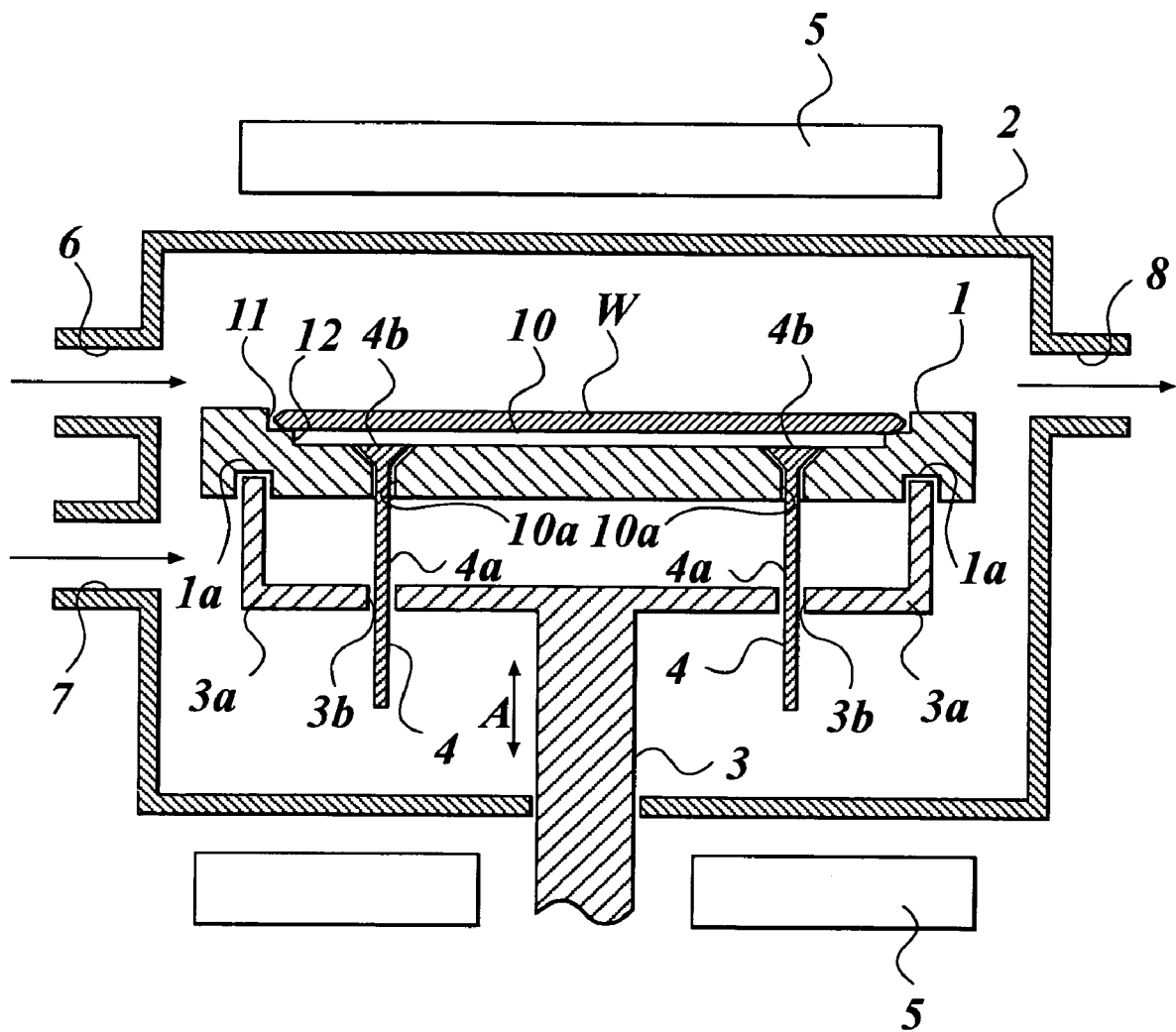
FIG. 3 is a schematic front cross-sectional view showing a vapor phase epitaxy apparatus, and shows a state where a silicon single crystal substrate is mounted within a spot facing of a susceptor.

As shown in FIG. 3, the vapor phase epitaxy apparatus 100 schematically includes: a disc-like susceptor 1 which supports a double-sided mirror silicon single crystal substrate W during vapor phase epitaxy; a reactor 2 inside which the susceptor 1 is arranged in an almost horizontal state in the inside; a susceptor supporting member 3 which supports the susceptor 1 from its under surface side; a lift pin 4 which vertically moves the double-sided mirror silicon single crystal substrate W relatively to the susceptor 1; a heating device 5 such as a halogen lamp which heats the inside of the reactor 2; a gas introduction duct 6 which introduces a silicon source gas into a region above the susceptor 1 within the reactor 2 to supply the gas on a front main surface of the double-sided mirror silicon single crystal substrate W on the susceptor 1; a purge gas introduction duct 7 which is disposed on the same side as that of the gas introduction duct 6 of the reactor 2 to introduce a purge gas into a region under the susceptor 1 within the reactor 2; and an exhaust duct 8 which is disposed on the opposite side of the reactor 2 relative to the reaction gas introduction duct 6 and the purge gas introduction duct 7 to discharge gas from the reactor 2.

On the front main surface of the susceptor 1, there is formed a spot facing 10 inside which the double-sided mirror silicon single crystal substrate W where a silicon epitaxial layer is epitaxially grown is mounted.

The spot facing 10 has, for example, a two-step structure including an upper spot facing section 11 which supports the peripheral portion of the double-sided mirror silicon single crystal substrate W, and a lower spot facing section 12 which is formed in a more central and lower position than that of the upper spot facing section 11.

Further, the susceptor 1 is made up of, for example, graphite coated with silicon carbide.

The susceptor supporting member 3 is provided movably in the vertical direction A, and on the top end portion of the susceptor supporting member 3, a plurality of support arms 3a are provided to be branched radially. The top end portions of the support arms 3a are fitted into recessed portions 1a formed on the rear main surface of the susceptor 1, thereby supporting the susceptor 1 such that the top surface thereof is almost horizontal.

Each of the lift pins 4 includes a body portion 4a formed in a rod shape, and a head portion 4b which is formed at the top end portion of the body portion 4a to support the double-sided mirror silicon single crystal substrate W mounted on the spot facing 10 from the under surface side of the substrate W. The head portion 4b is made larger in diameter than the body portion 4a so as to easily support the substrate W.

The lift pins 4 are inserted into lift pin through holes 10a formed on the bottom surface of the spot facing 10, and are placed such that the head portions 4b thereof face the bottom surface of the spot facing 10. Further, the body portions 4a of the lift pins 4 run through the through-holes 3b formed in the support arms 3a.

Next, a method for producing a silicon epitaxial wafer according to the present invention will be described with reference to FIGS. 1 and 2.

In the method for producing a silicon epitaxial wafer according to the present embodiment, the silicon single crystal substrate W is separated from the susceptor 1 using the lift pins 4 in a hydrogen heat treatment step (step S11; see FIG. 2) to be performed before a vapor phase epitaxy step (step S13; see FIG. 2) of epitaxially growing a silicon epitaxial layer on a front main surface of the silicon single crystal substrate W. As a result, a natural oxide film on the rear main surface of the silicon single crystal substrate W is evenly removed by etching. Thereafter, the silicon single crystal substrate W is mounted on the spot facing 10 and the silicon epitaxial layer is epitaxially grown on the front main surface of the substrate W.

Example 1 and Comparative Example 1 of the present invention will be described below.

Incidentally, in Example 1 and Comparative Example 1, and the after-mentioned respective Examples and Comparative Examples, a substrate of a p type with a diameter of 300 mm, a resistance of about 0.0015 Ω·cm and plane orientation of (100) is used as the double-sided mirror silicon single crystal substrate W. Further, a silicon epitaxial layer having a resistance of about 10 Ω·cm is epitaxially grown to a length of about 3 µm on the front main surface of the double-sided mirror silicon single crystal substrate W under vapor phase epitaxy conditions where a source gas is trichlorosilane and a growth temperature is 1150° C.

Further, a haze level x on a rear main surface of the silicon epitaxial wafer is measured using an optical surface inspection apparatus (not shown), and an intensity of scattered light obtained by optically scanning the rear main surface is expressed by a unit of ppm. Specifically, for example, 0.1 ppm means that scattered light having an intensity of 0.1 millionth of an intensity of incident light is measured. Further, the intensity of the scattered light is proportional to a size of surface roughness and therefore, for example, it is understood that when the intensity of the scattered light is large, unevenness is relatively large.

EXAMPLE 1

<Relation Between Separation from Susceptor and Haze Level>

(Cleaning Conditions)

The double-sided mirror silicon single crystal substrate W is subjected to SC1 cleaning and SC2 cleaning. Incidentally, each cleaning (including hydrofluoric acid cleaning (described later)) such as SC1 cleaning or SC2 cleaning in the cleaning step will be described in detail later.

(Hydrogen Heat Treatment Conditions Before Vapor Phase Epitaxy Step)

Example 1: In a state of separating the substrate W from the susceptor 1 using the lift pins 4, the hydrogen heat treatment is performed while keeping the state for 120 seconds at 1130° C. (see, FIG. 6A).

Comparative Example 1: In a state of mounting the substrate W on the susceptor 1, the hydrogen heat treatment is performed while keeping the state for 120 seconds at 1130° C. (see FIG. 6B).

Figure 6A:
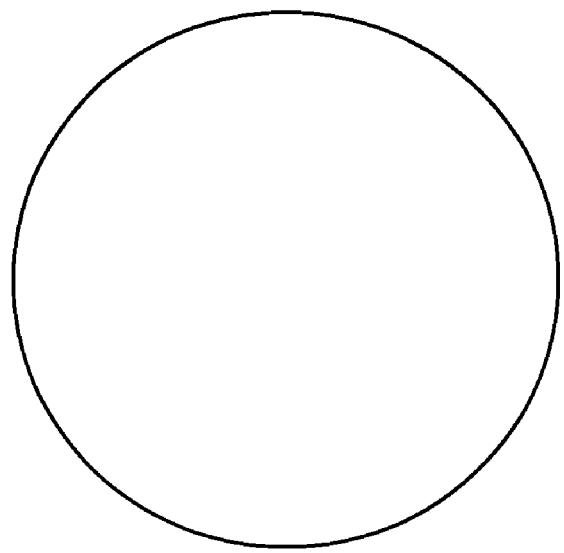
FIG. 6A is a view schematically showing a haze level on a rear main surface of a silicon epitaxial wafer in Example 1.
Figure 6B:
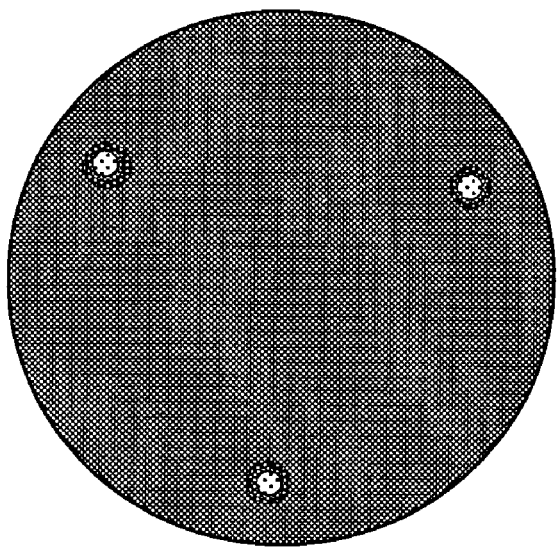
FIG. 6B is a view schematically showing a haze level of a rear main surface of a silicon epitaxial wafer in Comparative Example 1.

The measurement results of the haze level x on the rear main surface of the silicon epitaxial wafer produced under the above-described conditions are shown in FIGS. 6A and 6B.

[Evaluation]

As shown in FIG. 6B, the rear main surface of the silicon epitaxial wafer in Comparative Example 1 has regions where a haze level x is larger than 0.2 ppm and reaches several hundred ppm. Particularly, haze levels x at portions of the rear main surface facing the lift pin through-holes deteriorate. However, as shown in FIG. 6A, it is understood that when separating the double-sided mirror silicon single crystal substrate W from the susceptor 1 during the hydrogen heat treatment step (Example 1), the haze level x on the rear main surface of the silicon epitaxial wafer is from 0.1 ppm to 0.2 ppm and is improved as compared with that of Comparative Example 1.

Experiment Example

Incidentally, when supporting the double-sided mirror silicon single crystal substrate W by the lift pins 4 to separate the substrate W from the susceptor 1 and subjecting the substrate W to hydrogen heat treatment at a high temperature of 1150° C. or more, a stress is concentrated on places of the substrate W supported by the lift pins 4 and as a result, crystal defects such as slip dislocation may be induced in the substrate W.

Accordingly, in the present embodiment, a treatment temperature is lowered than a vapor phase epitaxy temperature to subject the substrate W to the hydrogen heat treatment and as a result, the induction of the slip dislocation is suppressed. However, when the hydrogen heat treatment temperature is excessively lowered, removal of a natural oxide film formed on the rear main surface of the substrate W is hardly performed sufficiently in the hydrogen heat treatment step. As a result, the haze level x on the rear main surface of the silicon epitaxial wafer deteriorates as shown in FIGS. 7A to 7C.

Figure 7A:
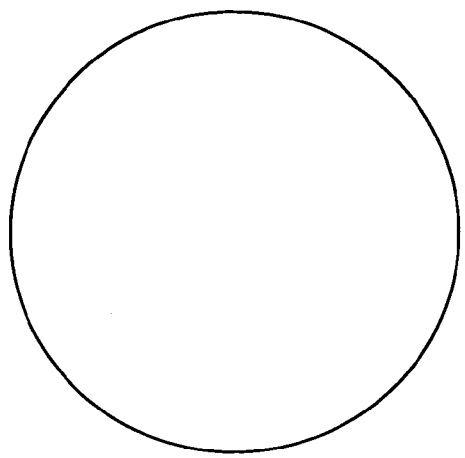
FIG. 7A is a view schematically showing a haze level of a rear main surface of a silicon epitaxial wafer of Experiment Example.
Figure 7B:
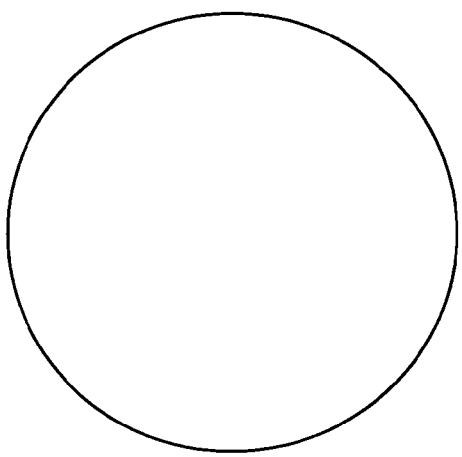
FIG. 7B is a view schematically showing a haze level of a rear main surface of a silicon epitaxial wafer of Experiment Example.
Figure 7C:
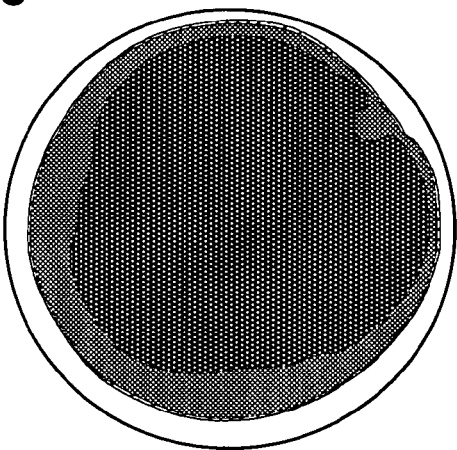
FIG. 7C is a view schematically showing a haze level of a rear main surface of a silicon epitaxial wafer of Experiment Example.

Herein, FIGS. 7A to 7C show measurement results, using an optical surface inspection apparatus, of the haze level x on the rear main surface of the silicon epitaxial wafer produced by subjecting the substrate W to hydrogen heat treatment while changing the treatment temperature (temperature within the reactor) on the double-sided mirror silicon single crystal substrate W to 1150° C. (FIG. 7A), 1100° C. (FIG. 7B) and 1050° C. (FIG. 7C) and then by epitaxially growing a silicon epitaxial layer on the front main surface of the substrate W.

As shown in FIG. 7C, when subjecting the substrate W to the hydrogen heat treatment while setting the treatment temperature to 1050° C., removal of a natural oxide film formed on the rear main surface of the substrate W cannot be sufficiently performed, and as a result, the haze level x on the rear main surface of the silicon epitaxial wafer is scarcely improved.

On this occasion, before the hydrogen heat treatment step, natural oxide film removal cleaning (step S5) may be performed as final cleaning in the cleaning step (steps S1 to S7; see FIG. 1) of cleaning the substrate W to previously remove the natural oxide film formed on the surface of the substrate W.

Herein, the double-sided mirror silicon single crystal substrate W is, for example, a substrate prepared in accordance with the following steps.

That is, a silicon single crystal ingot manufactured, for example, by a FZ (floating zone) method or a CZ (Czochralski) method is sliced using a slicer. After subjecting an edge of the sliced wafer to chamfering, both the surfaces are lapped and further subjected to chemical etching treatment. Further, both the main surfaces of the wafer after completion of the etching step are subjected to a mirror polishing finish by mechanochemical polishing. Thus, the double-sided mirror silicon single crystal substrate W is produced.

Figure 1:
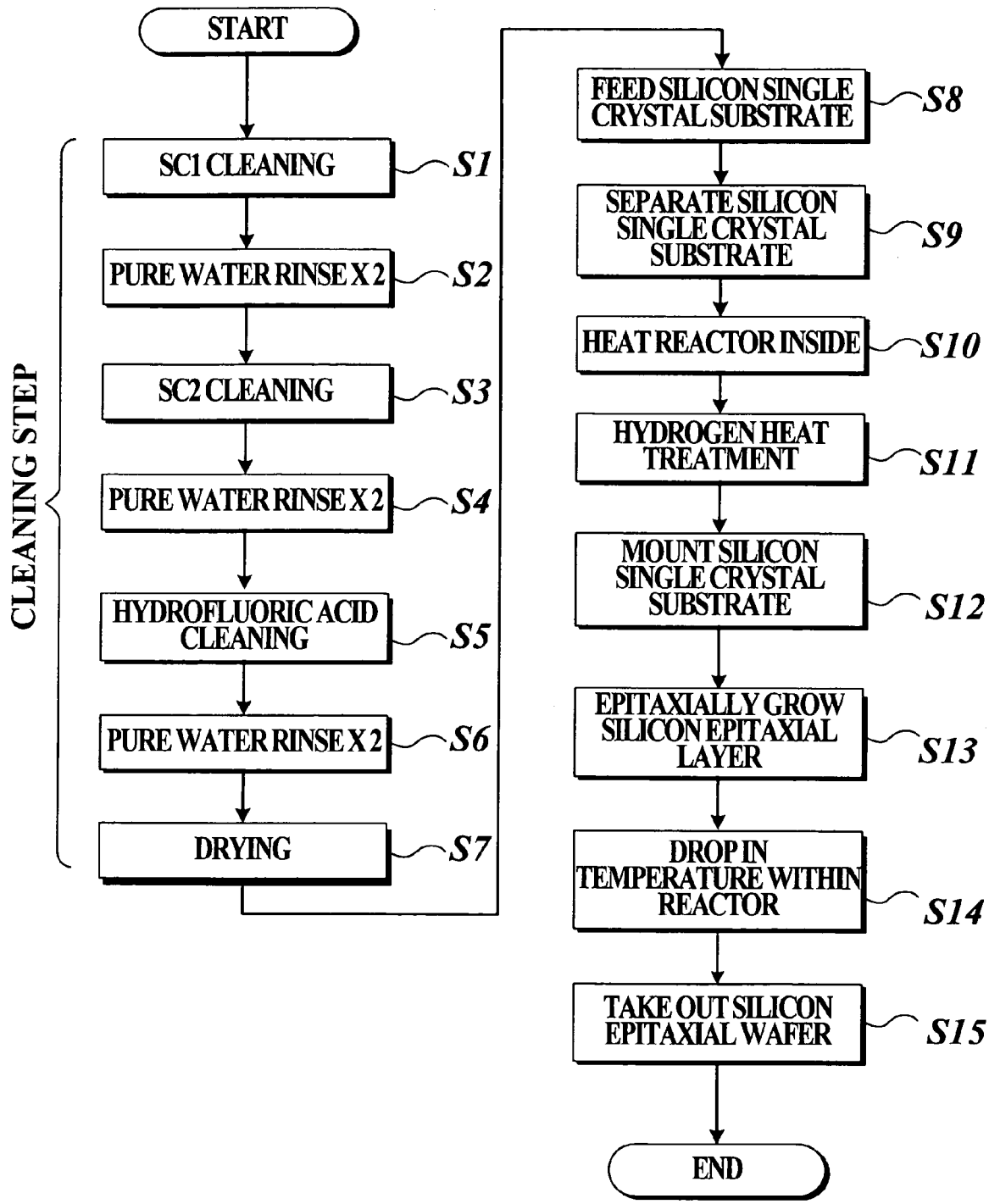
FIG. 1 is a view for illustrating each step of a method for producing a silicon epitaxial wafer exemplified as a first embodiment to which the present invention is applied.

Further, in the cleaning step of the double-sided mirror silicon single crystal substrate W prepared as described above, the SC1 cleaning is first performed as shown in FIG. 1 (step S1). In the SC1 cleaning, the double-sided mirror silicon single crystal substrate W is dipped into an SC1 chemical liquid tank filled with SC1 cleaning chemicals comprising a mixed solution composed of hydrogen peroxide solution ($H_2O_2$), ammonia water ($NH_4OH$) and purified water to thereby mainly remove particles adhered to the substrate W.

Next, the substrate W is dipped into a purified water tank to be rinsed with purified water (step S2). The pure water rinse is repeated, for example, twice.

Subsequently, SC2 cleaning is performed (step S3). In the SC2 cleaning, the double-sided mirror silicon single crystal substrate W is dipped into an SC2 chemical liquid tank filled with SC2 cleaning chemicals comprising a mixed solution composed of a hydrogen peroxide solution ($H_2O_2$), hydrochloric acid (HCl) and purified water to thereby mainly remove metal contaminations adhered to the substrate W.

Next, the substrate W is dipped into a purified water tank to be rinsed with purified water (step S4). The pure water rinse is repeated, for example, twice.

Next, hydrofluoric acid cleaning is performed (step S5) as natural oxide film removal cleaning for removing a natural oxide film formed on both the main surfaces of the substrate W. Specifically, the substrate W with natural oxide films formed on both the main surfaces thereof by the SC1 cleaning and the SC2 cleaning is dipped into a hydrofluoric acid chemical liquid tank in a predetermined concentration to thereby evenly remove by etching the natural oxide films on both the main surfaces of the substrate W.

Further, the substrate W is dipped into a purified water tank to be rinsed with purified water (step S6). The pure water rinse is repeated, for example, twice.

Subsequently, the substrate W is dried (step S7). Thus, the cleaning of the substrate is completed.

Figure 2:
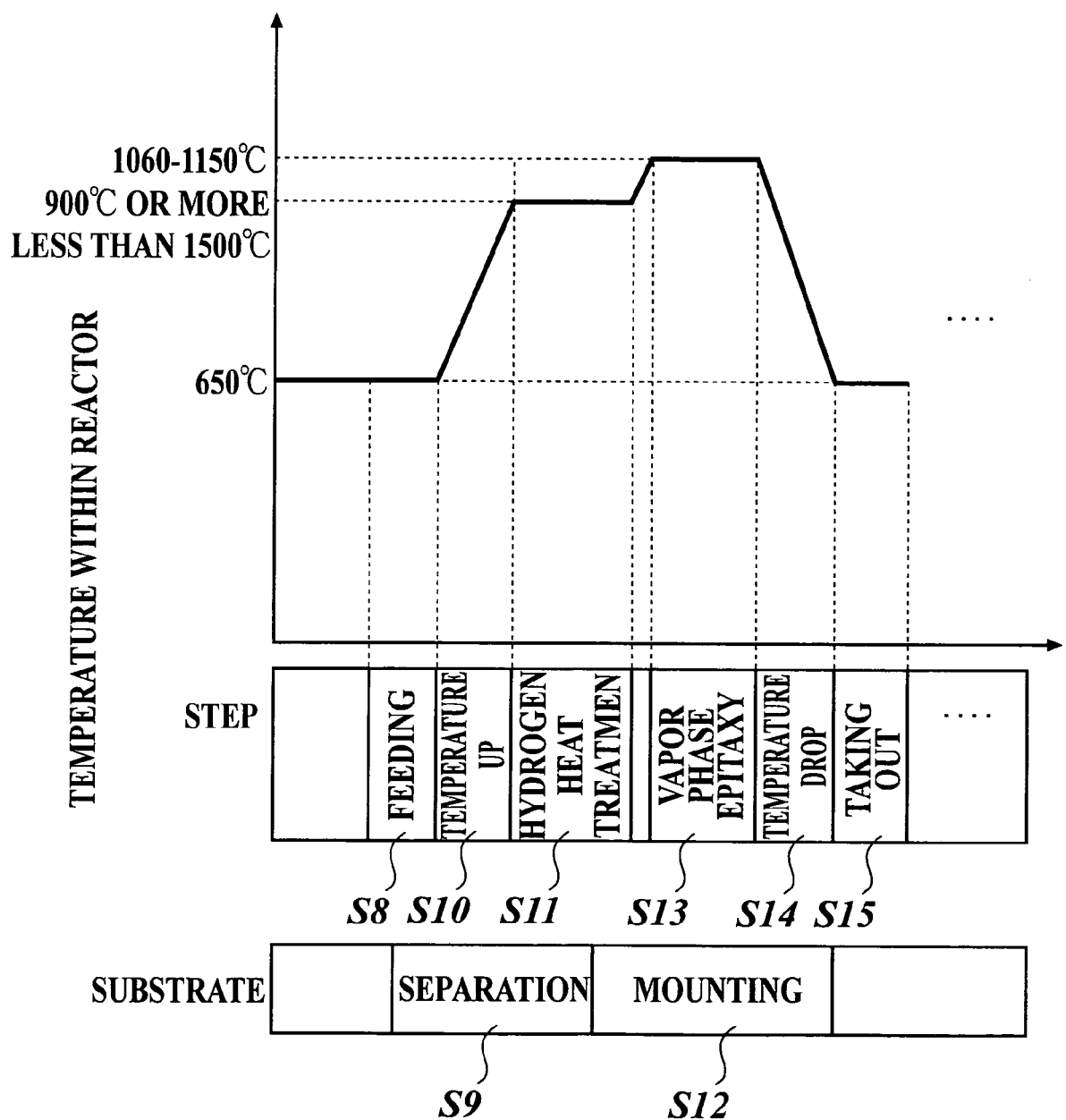
FIG. 2 is a view showing a correspondence among a temperature within a reactor, each producing step and arrangement state of a substrate according to a method for producing a silicon epitaxial wafer in FIG. 1.

Afterwards, the hydrogen heat treatment step and the vapor phase epitaxy step are performed, for example, using the vapor phase epitaxy apparatus 100 (FIG. 2).

Specifically, first, a hydrogen ($H_2$) gas is introduced into the reactor 2 as well as a temperature within the reactor 2 is set to a feeding temperature (e.g., about 650° C.) of the substrate W.

Next, the substrate W is fed into the reactor 2 (step S8). Specifically, first, the respective lift pins 4 are raised relatively to the susceptor 1 so as to protrude upward above the upper surface of the susceptor 1 by almost the same amount as each other. In other words, the susceptor 1 is lowered along with an operation of lowering the susceptor supporting member 3, the lower edges of the lift pins 4 reach, for example, the bottom surface of the reactor 2 in the course of this lowering, and while the lift pins 4 cannot be lowered any further, the susceptor 1 is further lowered. Thus, the lift pins 4 are raised relatively to the susceptor 1, which results in a state in which the substrate W is absent in FIG. 4.

Figure 4:
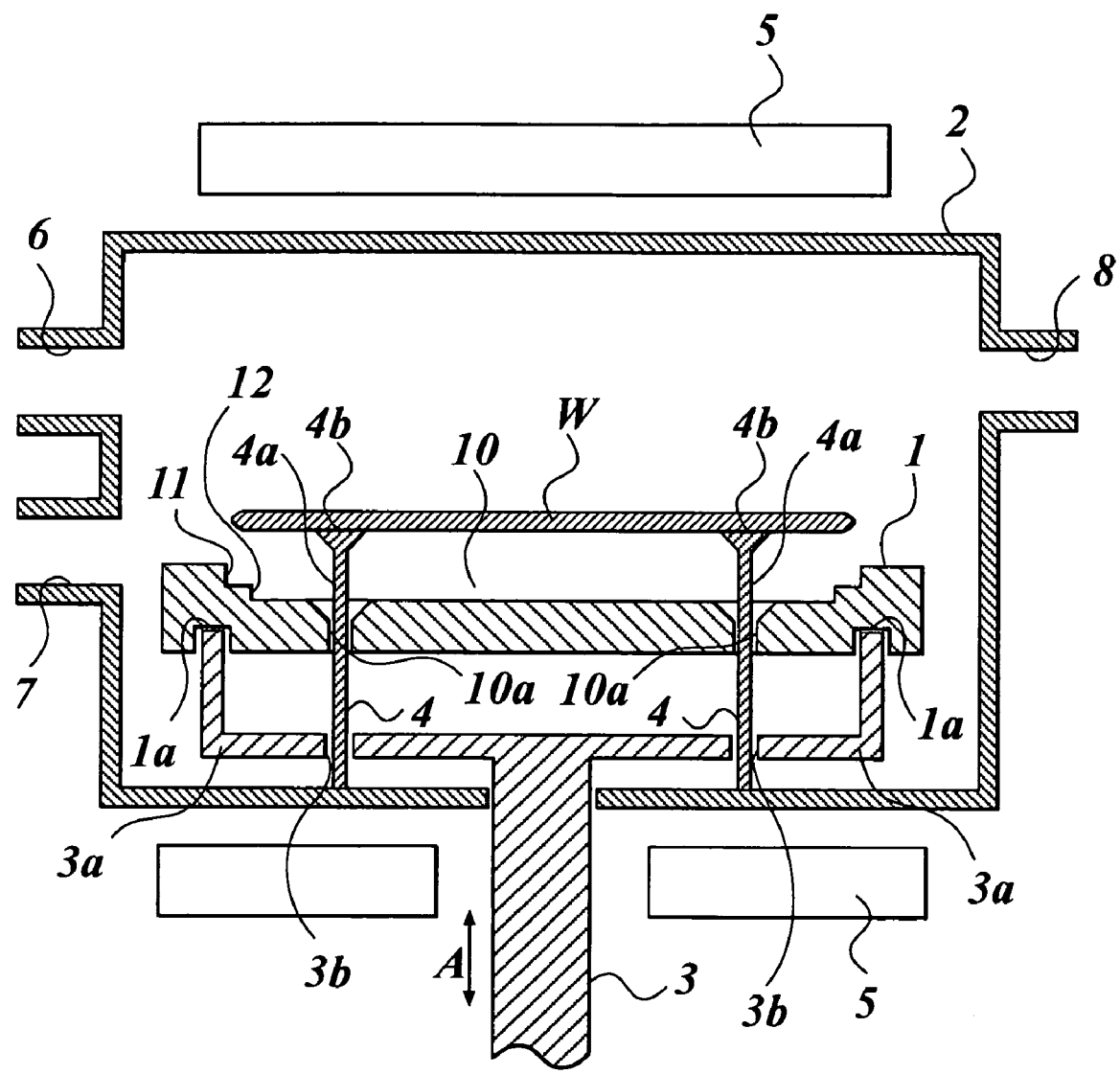
FIG. 4 is a schematic front cross-sectional view showing a vapor phase epitaxy apparatus, and shows a state where a silicon single crystal substrate is separated from a susceptor by a lift pin.

Further, the substrate W is conveyed into the reactor 2 by a handler (not shown) and, with the front main surface up, the substrate W is supported by the head portions 4b of the respective lift pins 4. Then, the handler is put back. Thus, the substrate W is fed into the reactor 2. As a result, as shown in FIG. 4, the substrate W is brought into a state of being separated from the susceptor 1 by the lift pins 4 (step S9). At this time, the susceptor 1 and the substrate W are brought into a state of being separated, for example, with a clearance of at least 1 mm from one another.

Next, the reactor 2 inside is heated (elevated in temperature) to the hydrogen heat treatment temperature which is considered to be a temperature lower than the after-mentioned vapor phase epitaxy temperature of the silicon epitaxial layer (step S10) to perform the hydrogen heat treatment (step S11). Specifically, in the hydrogen heat treatment, a state of separating the substrate W from the susceptor 1 is kept at a predetermined temperature for a predetermined time within the reactor 2 with a hydrogen atmosphere, and as a result, a natural oxide film formed on the rear main surface of the substrate W after the cleaning step is removed by etching using hydrogen. Accordingly, the natural oxide film on the rear main surface of the substrate W can be evenly removed surely.

Herein, a temperature within the reactor 2 when separating the substrate W from the susceptor 1 is preferably from 900 to less than 1150° C. (see FIGS. 8A to 8C and FIGS. 9A to 9C: for details, described later). In the hydrogen heat treatment at less than 900° C., the natural oxide film cannot be removed sufficiently and therefore, the haze level on the rear main surface of the silicon epitaxial wafer is scarcely improved. On the other hand, in the hydrogen heat treatment at 1150° C. or more, crystal defects such as slip dislocation occur frequently. In the hydrogen heat treatment step, a treatment at 1100° C. or less is more preferable for suppressing occurrence of crystal defects such as slip dislocation, and a temperature at 1000° C. or more is more preferable for keeping a haze level on the rear main surface to 50 ppm or less.

Further, a time for keeping a state of separating the substrate W from the susceptor 1 is preferably from 10 to 120 seconds. When the time is shorter than 10 seconds, the natural oxide film cannot be sufficiently removed by etching.

Also when the time is longer than 120 seconds, little effect is exerted on further improvement of a haze level.

Further, after a predetermined time passes in a state of separating the substrate W from the susceptor 1, the susceptor 1 is raised along with an operation of raising the susceptor supporting member 3. Further, when an upper surface of the upper spot facing section 11 of the spot facing 10 reaches the rear main surface of the substrate W in the course of the raising-up of the susceptor 1, the substrate W which has so far been supported on the head portions 4b of the lift pins 4 moves into a state of being supported by the upper surface of the upper spot facing section 11. As a result, the substrate W comes into a state of being mounted on the spot facing 10 (step S12).

Further, when upper edges of lift pin 4 through-holes 10a reach the head portions 4b of the lift pins 4, the lift pins 4 which have so far been supported, for example, by the bottom surface of the reactor 2 move into a state of being supported by the susceptor 1.

Further, the substrate W is further subjected to the hydrogen heat treatment for a predetermined time in a state of being mounted on the spot facing 10 of the susceptor 1, and as a result, the natural oxide film on the front main surface of the substrate W is completely removed. Thus, the hydrogen heat treatment is completed.

Next, the silicon epitaxial layer is epitaxially grown on the front main surface of the substrate W (step S13). Specifically, a temperature within the reactor 2 is set to a growth temperature (e.g., about 1150° C.) and a silicon source gas (e.g., trichlorosilane) introduced into the reactor 2 through the gas introducing duct 6 is supplied on the front main surface of the substrate W. Thus, the silicon epitaxial layer is epitaxially grown on the front main surface of the substrate W to produce the silicon epitaxial wafer.

Next, a temperature within the reactor 2 is cooled (dropped in temperature) up to a take-out temperature (e.g., about 650° C. which is the same as the substrate feeding temperature described above) (step S14), and then, the silicon epitaxial wafer is taken out from the reactor 2 inside (step S15).

As described above, according to the first embodiment, the substrate W is subjected to natural oxide film removal cleaning as final cleaning in the cleaning step before the vapor phase epitaxy, so that the natural oxide film formed on both the main surfaces of the substrate W can be removed. As a result, the natural oxide film formed on the surface of the substrate W during the storing in the air or during the cleaning can be once removed completely. Therefore, the substrate W has on both the main surfaces thereof only a relatively thin natural oxide film formed during the period that the substrate W is fed into the reactor 2 after the natural oxide film removal cleaning. Accordingly, even when performing the hydrogen heat treatment at the treatment temperature lower than the vapor phase epitaxy temperature of the silicon epitaxial layer during the hydrogen heat treatment step, the natural oxide film on the rear main surface of the substrate W can be surely removed. Further, the temperature within the reactor 2 when separating the substrate W from the susceptor 1 by the lift pins 4 is set to less than 1150° C., so that occurrence of the crystal defects such as slip dislocation can be suppressed.

Accordingly, the natural oxide film formed on the rear main surface of the substrate W can be evenly removed by etching. Therefore, in the subsequent vapor phase epitaxy step, fine unevenness can be prevented from occurring on the rear main surface of the substrate W, particularly, on the portions of the rear main surface facing the lift pin 4 through-holes 10a. As a result, no haze is observed under a collimated light or by an optical surface inspection apparatus. However, when the substrate W is stored in the air for 3 days or more after the natural oxide film removal cleaning, there is a high possibility that a thick natural oxide film is formed. Therefore, it is preferred to perform again the natural oxide film removal cleaning before feeding the substrate W into the reactor 2 (see, FIGS. 10A to 10C).

Example 2 and Comparative Example 2 of the present invention will be described below.

EXAMPLE 2

[Relation Between Hydrogen Heat Treatment Temperature and Haze Level]

(Storage Time After Hydrofluoric Acid Cleaning)

A double-sided mirror silicon single crystal substrate W which is stored for 34 hours in the air after the hydrofluoric acid cleaning is used.

(Hydrogen Heat Treatment Conditions)

Example 2: The substrate W is subjected to the hydrogen heat treatment while changing the treatment temperature to 900° C. (FIG. 8A: Example 2-1), 1000° C. (FIG. 8B: Example 2-2), 1050° C. (FIG. 8C: Example 2-3) and 1100° C. (FIG. 9A: Example 2-4). At this time, in a state of separating the substrate W from the susceptor 1, each hydrogen heat treatment is performed while keeping the state for 60 seconds at each treatment temperature.

Comparative Example 2: The treatment temperature is set to 1150° C., and in a state of separating the substrate W from the susceptor 1, the hydrogen heat treatment is performed while keeping the state for 60 seconds (FIG. 9B: Comparative Example 2-1), or in a state of mounting the substrate W on the susceptor 1, the hydrogen heat treatment is performed while keeping the state for 60 seconds (FIG. 9C: Comparative Example 2-2).

Measurement results of the haze level x on the rear main surface of the silicon epitaxial wafer produced under the above-described conditions are shown in FIGS. 8A to 8C and FIGS. 9A to 9C.

[Evaluation]

Figure 8A:
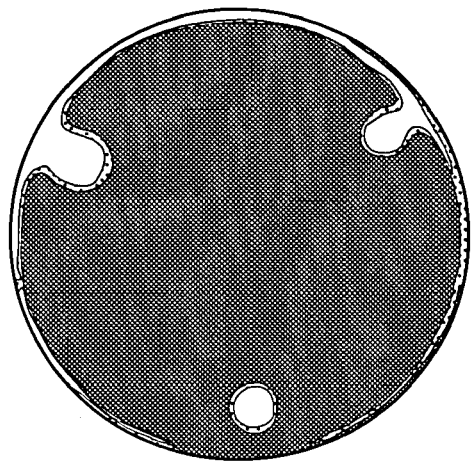
FIG. 8A is a view schematically showing a haze level of a rear main surface of a silicon epitaxial wafer of Example 2-1.
Figure 8B:
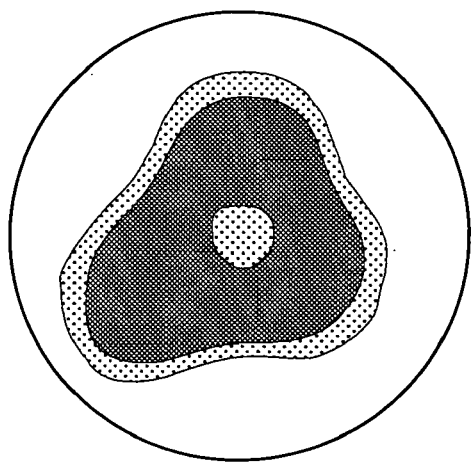
FIG. 8B is a view schematically showing a haze level of a rear main surface of a silicon epitaxial wafer of Example 2-2.
Figure 8C:
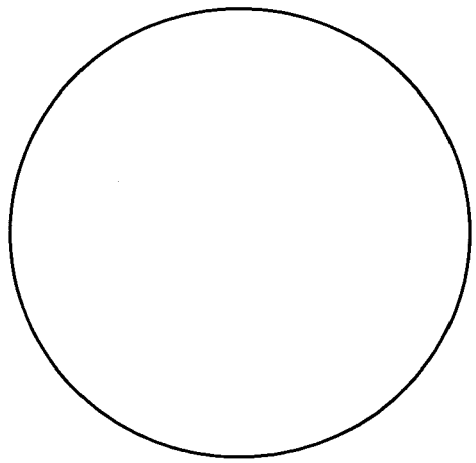
FIG. 8C is a view schematically showing a haze level of a rear main surface of a silicon epitaxial wafer of Example 2-3.
Figure 9A:
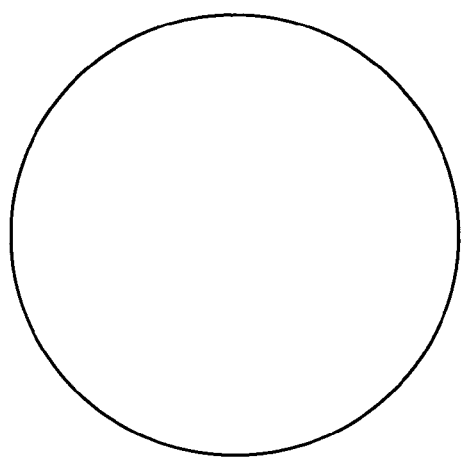
FIG. 9A is a view schematically showing a haze level of a rear main surface of a silicon epitaxial wafer of Example 2-4.
Figure 9B:
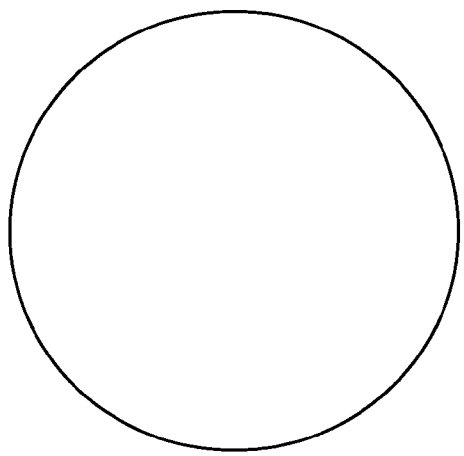
FIG. 9B is a view schematically showing a haze level of a rear main surface of a silicon epitaxial wafer of Comparative Example 2-1.
Figure 9C:
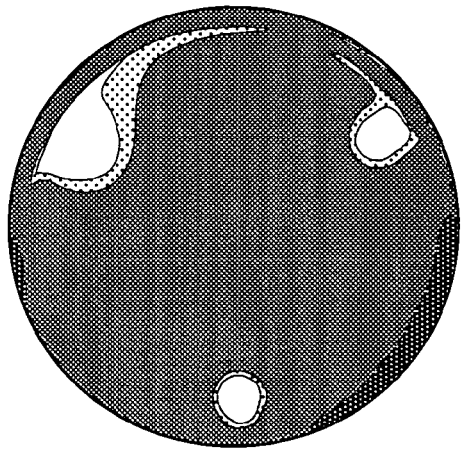
FIG. 9C is a view schematically showing a haze level of a rear main surface of a silicon epitaxial wafer of Comparative Example 2-2.

As shown in FIGS. 8A to 8C and FIGS. 9A and 9B, when subjecting the substrate W to the hydrogen heat treatment by separating the substrate W from the susceptor 1 and by setting a treatment temperature within the reactor 2 to from 900° C. to 1150° C., the haze level x on the rear main surface of the silicon epitaxial wafer can be improved, as compared with an example of subjecting the substrate W to the hydrogen heat treatment in a state of mounting the substrate W on the susceptor 1 (see, FIG. 9C: Comparative Example 2-2).

However, when the hydrogen heat treatment temperature is 1150° C. (see, FIG. 9B: Comparative Example 2-1) or more, crystal defects such as slip dislocation occur frequently. Therefore, when the hydrogen heat treatment temperature is set to less than 1150° C. or more preferably to 1100° C. or less as shown in FIG. 9A (Example 2-4), occurrence of the crystal defects such as slip dislocation can be suppressed. Further, as shown in FIG. 8A (Example 2-1), when the hydrogen heat treatment temperature is set to 900° C. or more, the haze level on the whole rear main surface of the silicon epitaxial wafer can be kept to from 0.1 to 50 ppm. Further, as shown in FIG. 8C (Example 2-3), when the hydrogen heat treatment temperature is set to 1050° C. or more, the haze level on the whole rear main surface of the silicon epitaxial wafer can be kept to from 0.1 to 0.5 ppm.

Example 3 and Comparative Example 3 of the present invention will be described below.

EXAMPLE 3

[Relation Between Storage Time After Hydrofluoric Acid Cleaning and Haze Level]

(Storage Time After Hydrofluoric Acid Cleaning)

Figure 10A:
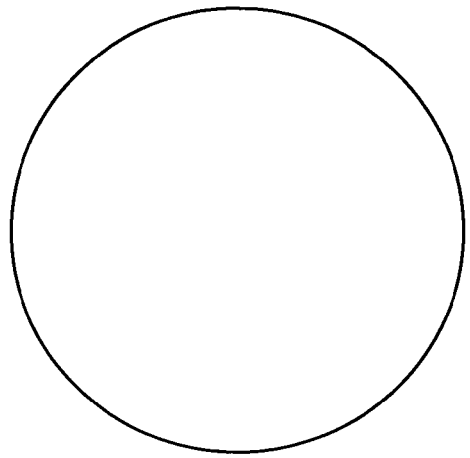
FIG. 10A is a view schematically showing a haze level of a rear main surface of a silicon epitaxial wafer of Example 3-1.

The hydrofluoric acid cleaning as the natural oxide film removal cleaning is performed as final cleaning in the cleaning step, and the double-sided mirror silicon single crystal substrate W after the hydrofluoric acid cleaning is stored in the air for 34 hours (FIG. 10A: Example 3-1), 64 hours (FIG. 10B: Example 3-2) and 120 hours (FIG. 10C: Comparative Example 3).

(Hydrogen Heat Treatment Conditions)

Figure 10B:
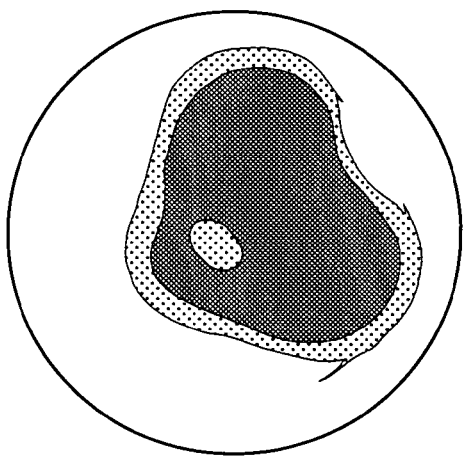
FIG. 10B is a view schematically showing a haze level of a rear main surface of a silicon epitaxial wafer of Example 3-2.
Figure 10C:
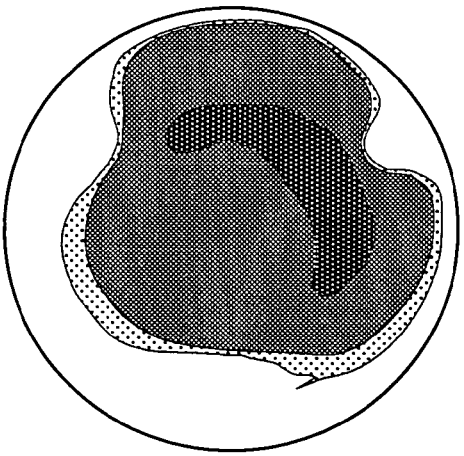
FIG. 10C is a view schematically showing a haze level of a rear main surface of a silicon epitaxial wafer of Comparative Example 3.

The hydrogen heat treatment temperature is set to 1050° C., and in a state of separating the substrate W from the susceptor 1, each hydrogen heat treatment is performed while keeping the state for 60 seconds Measurement results of the haze level x on the rear main surface of the silicon epitaxial wafer produced under the above-described conditions are shown in FIGS. 10A to 10C.

[Evaluation]

As shown in FIG. 10C, when setting the storage time of the substrate W to 120 hours (5 days) (Comparative Example 3), a thick natural oxide film is formed on the rear main surface of the substrate W during the storage. Therefore, even when subjecting the substrate W to the hydrogen heat treatment by separating the substrate W from the susceptor 1, the natural oxide film cannot be removed sufficiently.

On the other hand, as shown in FIG. 10A, when setting the storage time of the substrate W to 34 hours (Example 3-1), the natural oxide film formed on the rear main surface of the substrate W is almost completely removed by etching through the hydrogen heat treatment, so that the haze level on the whole rear main surface of the silicon epitaxial wafer can be kept to from 0.1 to 0.5 ppm. Further, as shown in FIG. 10B, when setting the storage time of the substrate W to 64 hours (2.7 days) (Example 3-2), it becomes difficult to completely remove, through the hydrogen heat treatment, the natural oxide film formed on the rear main surface of the substrate W. However, the natural oxide film can be removed by etching to a degree where the haze level on the whole rear main surface of the silicon epitaxial wafer is 50 ppm or less. In other words, when separating the substrate W from the susceptor 1 to subject the substrate W to the hydrogen heat treatment at a temperature of 1000° C. or more within 3 days after the natural oxide film removal cleaning, the haze level on the whole rear main surface of the subsequently produced silicon epitaxial wafer can be suppressed to 50 ppm or less.

Second Embodiment

In a method for producing a silicon epitaxial wafer according to the second embodiment, front main surface oxide film formation cleaning (corresponding to ozone water cleaning in a step S103; see FIG. 5) for forming an oxide film on the front main surface of the double-sided mirror silicon single crystal substrate W is performed as final cleaning of the front main surface of the substrate W in the cleaning step performed before the hydrogen heat treatment step.

In other words, in the cleaning step, when performing removal of the natural oxide film on both the main surfaces, for example, using hydrofluoric acid as final cleaning of both the main surfaces of the substrate W, both the main surfaces of the substrate W treated using hydrofluoric acid come into a high-activity state. As a result, foreign matters such as particles are easily adhered to the high-activity front surface of the substrate W (see Table 1). When foreign matters such as particles are once adhered thereto, the removal thereof is not easy. Further, when epitaxially growing the silicon epitaxial layer in a state where the foreign matters are adhered to the front main surface, crystal defects easily occur.

Accordingly, in the method for producing a silicon epitaxial wafer of the second embodiment, the cleaning of the front main surface and rear main surface of the substrate W is performed for each main surface using, for example, a single wafer cleaning device (not shown). In other words, the natural oxide film removal cleaning is performed as final cleaning of the rear main surface of the substrate W in order to suppress occurrence of the haze. On the other hand, the oxide film formation cleaning is performed as final cleaning of the front main surface in order to suppress adhesion of foreign matters such as particles.

The method for producing a silicon epitaxial wafer according to the present invention will be described below with reference to FIG. 5.

Figure 5:
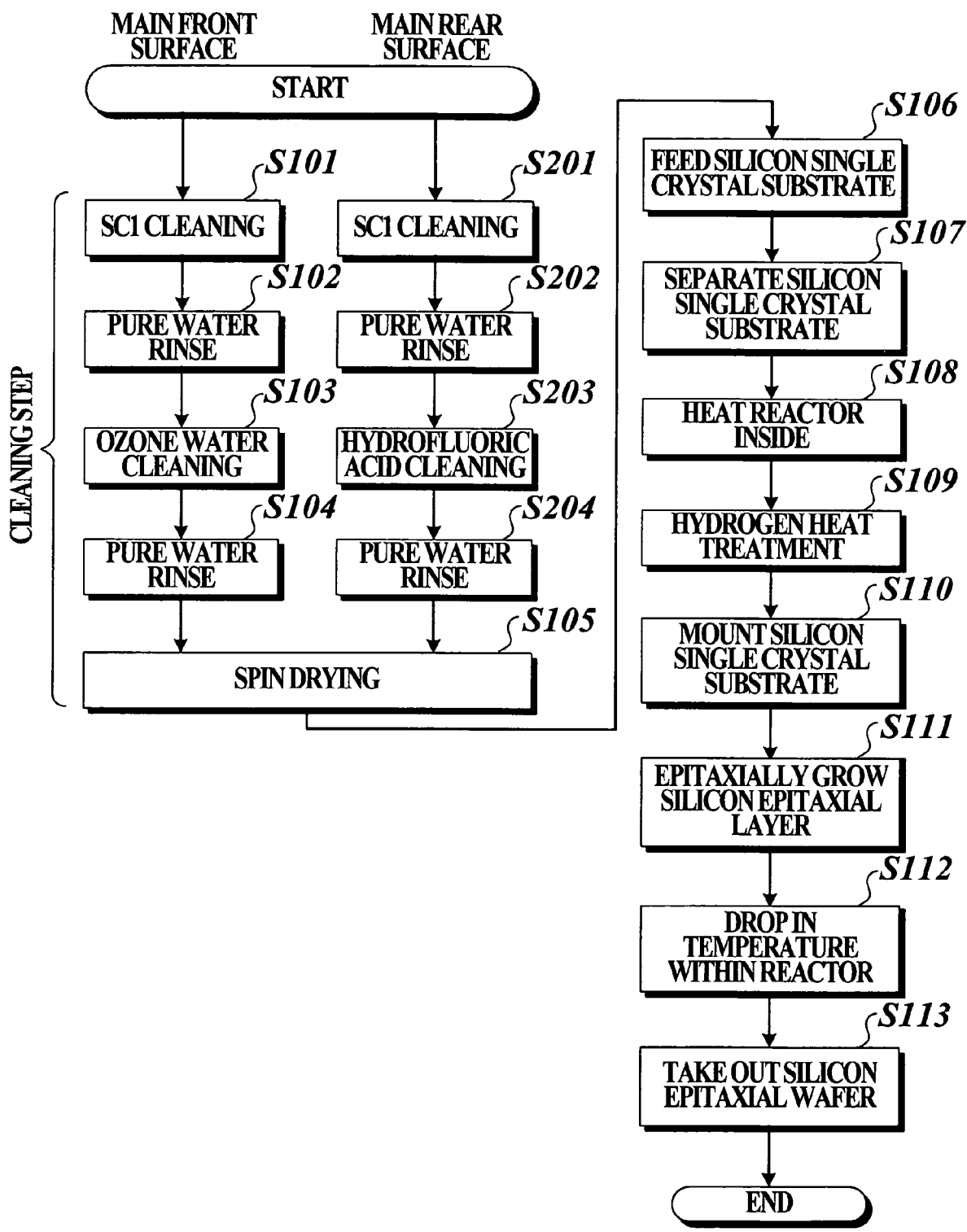
FIG. 5 is a view for illustrating each step of a method for producing a silicon epitaxial wafer exemplified as a second embodiment to which the present invention is applied.

Specifically, as shown in FIG. 5, first, the substrate W is fed, for example, into the single wafer cleaning device using a predetermined carrier. Then, chemicals for SC1 cleaning are sprayed on the front main surface of the substrate W from a predetermined nozzle to perform the SC1 cleaning of the front main surface of the substrate W (step S101). Further, chemicals for SC1 cleaning are sprayed also on the rear main surface of the substrate W from a predetermined nozzle to perform the SC1 cleaning of the rear main surface of the substrate W (step S201). By the SCI cleaning, particles adhered to both the main surfaces of the substrate W are removed.

Next, purified water is sprayed on the front main surface of the substrate W from a predetermined nozzle to perform a pure water rinse (step S102). Further, purified water is sprayed also on the rear main surface of the substrate W from a predetermined nozzle to perform a pure water rinse (step S202).

Subsequently, front main surface oxide film formation cleaning is performed as final cleaning of the front main surface of the substrate W. In the front main surface oxide film formation cleaning, for example, ozone water cleaning is performed (step S103), and as a result, an ozone oxide film as an oxide film is formed on the front main surface of the substrate W. Specifically, ozone water is sprayed on the front main surface of the substrate W from a predetermined nozzle of the cleaning device, and as a result, a fine ozone oxide film which is suppressed in adhesion of foreign matters such as particles is formed on the front main surface of the substrate W.

Further, rear main surface natural oxide film removal cleaning is performed as final cleaning of the rear main surface of the substrate W. In the rear main surface natural oxide film removal cleaning, for example, hydrofluoric acid cleaning is performed (step S203), and as a result, a natural oxide film formed on the rear main surface of the substrate W during the SC1 cleaning in step S201 is removed by etching using hydrofluoric acid.

Thereafter, purified water is sprayed on the front main surface of the substrate W from a predetermined nozzle to perform a pure water rinse (step S104). Further, purified water is sprayed also on the rear main surface of the substrate W from a predetermined nozzle to perform a pure water rinse (step S204).

Next, drying of the substrate W is performed. In the drying of the substrate W, for example, spin drying is performed by rotating the substrate W at a predetermined speed to remove waterdrops on the front surface of the substrate W by a centrifugal force (step S105).

Thus, the cleaning step of the substrate W is completed.

Thereafter, the cleaned substrate W is fed into the vapor phase epitaxy apparatus 100 (step S106) to perform the hydrogen heat treatment step in the same manner as in the first embodiment. In other words, in the hydrogen heat treatment step, the substrate W is separated from the susceptor 1 (step S107). In this state, the reactor 2 inside is heated (elevated in temperature) to the hydrogen heat treatment temperature which is considered to be a temperature lower than the vapor phase epitaxy temperature of the silicon epitaxial layer (step S108) to perform the hydrogen heat treatment (step S109). As a result, an ozone oxide film on the front main surface of the substrate W exposed to a hydrogen atmosphere within the reactor 2 and a natural oxide film formed on the rear main surface of the substrate W after the cleaning step are removed by etching using hydrogen. Accordingly, the natural oxide film on the rear main surface of the substrate W can be evenly removed surely.

Thereafter, the substrate W is mounted within the spot facing 10 of the susceptor 1 (step S110). In this state, the substrate W is further subjected to the hydrogen heat treatment for a predetermined time, and as a result, the ozone oxide film on the front main surface of the substrate W is completely removed. Thus, the hydrogen heat treatment is completed.

Next, in the same manner as in the first embodiment, the silicon epitaxial layer is epitaxially grown on the front main surface of the substrate W to produce the silicon epitaxial wafer. Then, the produced silicon epitaxial wafer is taken out from the reactor 2 inside (steps S111 to 113).

As described above, according to the second embodiment, the front main surface oxide film formation cleaning is performed as final cleaning of the front main surface of the substrate W in the cleaning step, so that the oxide film can be formed on the front main surface of the substrate W. Accordingly, unlike a case where also the front main surface of the substrate W is cleaned using hydrofluoric acid as final cleaning in the cleaning step, the front main surface of the substrate W is low in the activity and therefore, foreign matters such as particles are hardly adhered, so that occurrence of the crystal defects of the silicon epitaxial layer due to adhesion of the foreign matters can be suppressed.

Incidentally, in the first and second embodiments, during the period from feeding the substrate W into the reactor 2 until completing a state of separating the substrate W from the susceptor 1, the substrate W remains in a state of being separated from the susceptor 1. However, the present invention is not limited thereto and the substrate W may be separated from the susceptor 1 only for a predetermined time at least during the hydrogen heat treatment step.

Further, separation of the substrate W from the susceptor 1 is performed using the lift pins 4. However, the present invention is not limited thereto, and it is needless to say that the substrate W may be separated from the susceptor 1 using any method. Further, separation of the substrate W from the susceptor 1 is performed by lowering the susceptor 1 relatively to the lift pins 4. However, the present invention is not limited thereto. For example, using a construction such that the lift pins 4 can be raised with respect to the susceptor 1 irrespective of vertical movement of the susceptor 1, the substrate W may be separated from the susceptor 1 by raising the lift pins 4.

Further, it can be appropriately changed whether the front main surface natural oxide film removal cleaning and rear main surface natural oxide film removal cleaning for removing a natural oxide film are performed as final cleaning of the front main surface and rear main surface of the substrate W in the cleaning step. In the present invention, at least, the substrate W may be separated from the susceptor 1 during the hydrogen heat treatment step and the substrate W may be mounted on the spot facing 10 of the susceptor 1 during the vapor phase epitaxy step.

Example 4 and Comparative Example 4 according to the present invention will be described below.

EXAMPLE 4

<Comparison Between Cleaning Conditions>

(Cleaning Conditions)

Example 4: Ozone water cleaning is performed as final cleaning of the front main surface of the substrate W and hydrofluoric acid cleaning is performed as final cleaning of the rear main surface of the substrate W.

Comparative Example 4: Hydrofluoric acid cleaning is performed as final cleaning of both the main surfaces of the substrate W.

(Measurement of the Number of Particles Immediately After the Cleaning Step)

Using a light scattering optical surface inspection apparatus, the number of particles having a size of 0.12 μm or more in diameter on the front main surface of the substrate W immediately after the cleaning step is measured.

(Measurement of the Number of Particles Immediately After the Vapor Phase Epitaxy Step)

Using a light scattering optical surface inspection apparatus, the number of particles having a size of 0.12 μm or more in diameter on the silicon epitaxial layer of the silicon epitaxial wafer is measured.

Measurement results of the number of particles in Example 4 and Comparative Example 4 are shown in Table 1.

TABLE 1

|  | Example 4 | Comparative Example 4 |
| --- | --- | --- |
| Final Cleaning | Front main surface: $O_3$ Rear main surface: HF | Front main surface: HF Rear main surface: HF |
| Immediately After Cleaning Step (number of particles/Substrate) | 0 | $1.5 \times 10^3$ |
| Immediately After Vapor Phase Epitaxy Step (number of particles/Wafer) | 10 | 25 |

[Evaluation]

In the case of performing the hydrofluoric acid cleaning as final cleaning of both the main surfaces of the substrate W (Comparative Example 4), $1.5 \times 10^3$ particles per substrate are measured immediately after the cleaning step, and further, 25 particles per silicon epitaxial wafer are measured immediately after the vapor phase epitaxy step.

On the other hand, in the case of performing the ozone water cleaning as final cleaning of the front main surface of the substrate W and performing the hydrofluoric acid cleaning as final cleaning of the rear main surface of the substrate W (Example 4), no particle having a size of 0.12 µm or more in diameter is measured, and further, also the number of particles to be measured per silicon epitaxial wafer immediately after the vapor phase epitaxy step can be reduced to 10.

Third Embodiment

In a method for producing a silicon epitaxial wafer according to the third embodiment, there is used a construction such that in the cleaning step, the front main surface oxide film formation cleaning is performed as final cleaning of the front main surface of the substrate W, for example, using ozone water as well as the rear main surface natural oxide film removal cleaning is performed as final cleaning of the rear main surface of the substrate W, for example, using hydrofluoric acid, the substrate W is then quickly fed into the reactor 2 with a non-oxidation atmosphere and the hydrogen heat treatment step is performed not in a state of separating the substrate W from the susceptor 1 but in a state of mounting the substrate W on the spot facing 10, unlike the first and second embodiments.

When setting to 6 hours or less a time for storing the substrate W in the air as an oxidizing atmosphere during the period that the substrate W is fed into the reactor 2 with a non-oxidizing atmosphere (e.g., a hydrogen atmosphere) after the final cleaning, a natural oxide film having a thickness at a level causing haze on the rear main surface of the silicon epitaxial wafer is hardly formed on the rear main surface of the substrate W.

In other words, when setting the storage time in the air to 6 hours or less, the natural oxide film on the rear main surface of the substrate W is sufficiently removed by etching even when mounting the substrate W on the spot facing 10 of the susceptor 1 within the reactor 2 and subjecting the substrate W to the hydrogen heat treatment in the hydrogen heat treatment step. Therefore, in the subsequent vapor phase epitaxy step, fine unevenness can be prevented from occurring on the rear main surface of the substrate W, particularly, on the portions of the rear main surface facing the lift pin 4 through-holes 10a, so that when measuring the haze level using the optical surface inspection apparatus, the haze level on the whole rear main surface of the silicon epitaxial wafer can be suppressed to 50 ppm or less.

Incidentally, in the second and third embodiments, there is used a construction such that in the front main surface oxide film formation cleaning, the ozone oxide film is formed as an oxide film on the front main surface of the substrate W. However, the present invention is not limited thereto and there may be used a construction such that an oxide film other than the ozone oxide film is formed.

Further, the present invention is not limited to the above-described embodiments. For example, the hydrofluoric acid cleaning is performed as the rear main surface natural oxide film removal cleaning; however, other cleaning methods may be used as long as the natural oxide film on the rear main surface can be removed.

Further, in the second embodiment, there may be of course used a construction that fine particles adhered to the substrate W are removed using scrub cleaning in place of the SC1 cleaning.

Further, description is made on the susceptor 1 in which the spot facing 10 having the upper spot facing section 11 and the lower spot facing section 12 is formed. However, the shape of the spot facing 10 is not limited thereto. The shape of the spot facing 10 may be any as long as it is a shape capable of mounting the substrate W.

In addition, the single wafer vapor phase epitaxy apparatus 100 is illustrated as an apparatus for producing the silicon epitaxial wafer. However, the present invention is not limited thereto and a batch vapor phase epitaxy apparatus may be used.

Example 5 and Comparative Example 5 of the present invention will be described below.

EXAMPLE 5

<Relation Between Storage Time in the Air and Haze Level>

(Cleaning Conditions)

Ozone water cleaning is performed as final cleaning of the front main surface of the substrate W and hydrofluoric acid cleaning is performed as final cleaning of the rear main surface of the substrate W.

(Storage Time in the Air After Hydrofluoric Acid Cleaning)

Figure 11A:
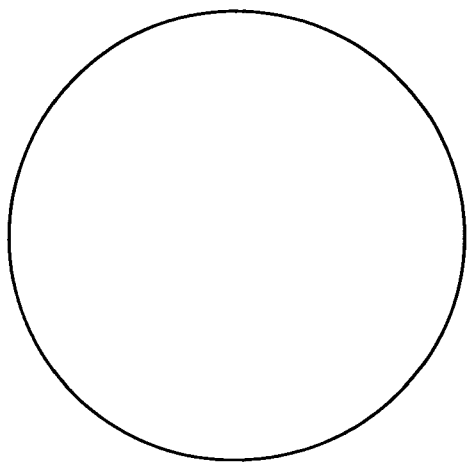
FIG. 11A is a view schematically showing a haze level of a rear main surface of a silicon epitaxial wafer of Example 5-1.
Figure 11B:
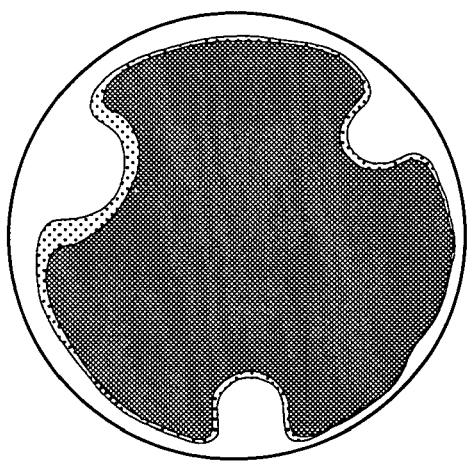
FIG. 11B is a view schematically showing a haze level of a rear main surface of a silicon epitaxial wafer of Example 5-2.
Figure 11C:
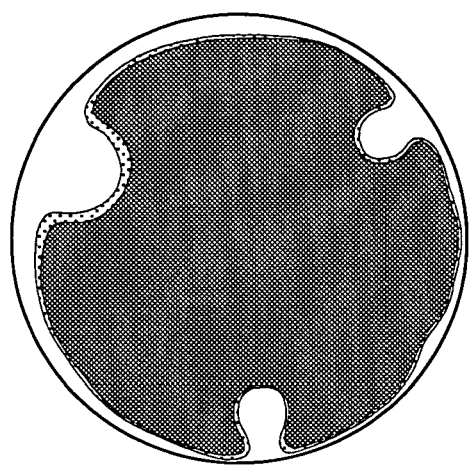
FIG. 11C is a view schematically showing a haze level of a rear main surface of a silicon epitaxial wafer of Example 5-3.
Figure 11D:
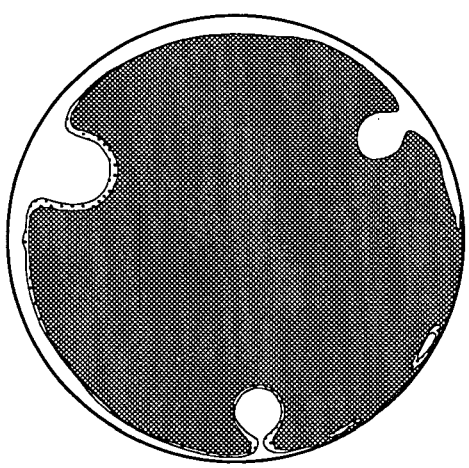
FIG. 11D is a view schematically showing a haze level of a rear main surface of a silicon epitaxial wafer of Example 5-4.
Figure 12A:
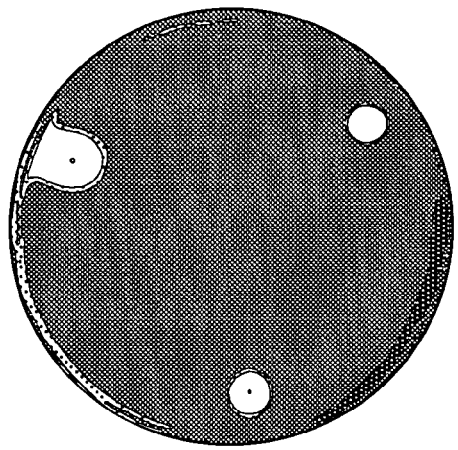
FIG. 12A is a view schematically showing a haze level of a rear main surface of a silicon epitaxial wafer of Comparative Example 5-1.
Figure 12C:
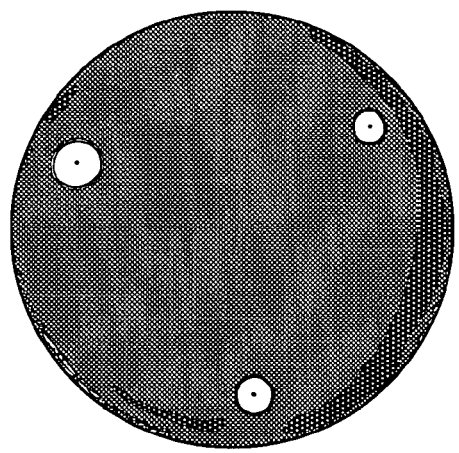
FIG. 12C is a view schematically showing a haze level of a rear main surface of a silicon epitaxial wafer of Comparative Example 5-3.
Figure 12B:
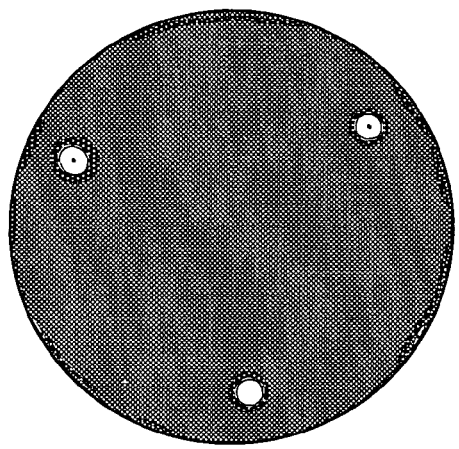
FIG. 12B is a view schematically showing a haze level of a rear main surface of a silicon epitaxial wafer of Comparative Example 5-2.
Figure 12D:
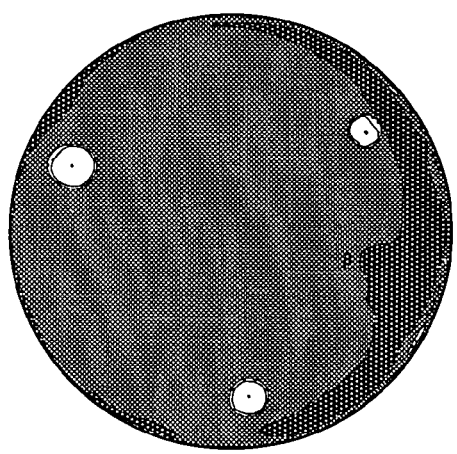
FIG. 12D is a view schematically showing a haze level of a rear main surface of a silicon epitaxial wafer of Comparative Example 5-4.

Each substrate W after the hydrofluoric acid cleaning is stored in the air for the storage time of 0 hour (herein, when feeding the substrate W into the reactor 2 within 20 minutes after the hydrofluoric acid cleaning, the storage time is set to 0 hour. FIG. 11A: Example 5-1), 1.5 hours (FIG. 11B: Example 5-2), 3 hours (FIG. 11C: Example 5-3), 6 hours (FIG. 11D: Example 5-4), 12 hours (FIG. 12A: Comparative Example 5-1), 24 hours (FIG. 12B: Comparative Example 5-2), 48 hours (FIG. 12C: Comparative Example 5-3) and 96 hours (FIG. 12D: Comparative Example 5-4). After the completion of the storage time in the air, each substrate W is immediately fed into the reactor 2 with a hydrogen atmosphere, for example, through a load lock chamber with a nitrogen atmosphere.

(Hydrogen Heat Treatment Conditions)

The hydrogen heat treatment temperature is set to 1050° C., and in a state of mounting the substrate W on the susceptor 1, each hydrogen heat treatment is performed while keeping the state for 60 seconds.

Measurement results of the haze level x on the rear main surface of the silicon epitaxial wafer produced under the above-described conditions are shown in FIGS. 11A to 11D and FIGS. 12A to 12D.

[Evaluation]

As shown in FIGS. 12A to 12D, when setting the storage time in the air after cleaning the rear main surface of the substrate W with hydrofluoric acid to 12 hours or more (Comparative Example 5; Comparative Examples 5-1 to 5-4), a natural oxide film is formed on the rear main surface of the substrate W during the storage, and as a result, haze at a level larger than 50 ppm is visualized on the rear main surface of the silicon epitaxial wafer.

On the contrary, as shown in FIGS. 11A to 11D (Example 5; Examples 5-1 to 5-4), as the storage time in the air becomes longer from 0 hour, the haze level x on the whole rear main surface of the silicon epitaxial wafer more deteriorates; however, when the time for storing the substrate W in the air after the hydrofluoric acid cleaning is 6 hours or less, the haze level x on the whole rear main surface of the silicon epitaxial wafer can be kept to 50 ppm or less even when the substrate W is not separated from the susceptor 1 during the hydrogen heat treatment.

INDUSTRIAL APPLICABILITY

As described above, the method for producing a silicon epitaxial wafer and the silicon epitaxial wafer according to the present invention are capable of preventing fine unevenness from occurring on the rear main surface of the double-sided mirror silicon epitaxial wafer as well as are useful for improving the haze level on the rear main surface of the silicon epitaxial wafer. Particularly, the producing method of a silicon epitaxial wafer and the silicon epitaxial wafer are capable of preventing fine unevenness from occurring on the portions of the rear main surface of the silicon epitaxial wafer facing the lift pin through-holes, as well as are useful when suppressing the haze level on the whole rear main surface of the silicon epitaxial wafer to 50 ppm or less.

| Explanation of Reference Numerals | |
|---|---|
| 1 | Susceptor |
| 2 | Reactor |
| 4 | Lift pin |
| 10 | Spot facing |
| 10a | Through-hole |
| W | Doublesided mirror silicon single crystal substrate |

The invention claimed is:

1. A method for producing a silicon epitaxial wafer, comprising:
   a hydrogen heat treatment step of arranging a susceptor capable of mounting a silicon single crystal substrate within a reactor and subjecting the silicon single crystal substrate mounted on a spot face of the susceptor to heat treatment in a hydrogen atmosphere; and
   a vapor phase epitaxy step of epitaxially growing a silicon epitaxial layer after the hydrogen heat treatment step,
   wherein the silicon single crystal substrate is separated from the susceptor during the hydrogen heat treatment step by allowing a lift pin which vertically moves the silicon single crystal substrate relatively to the susceptor to support the silicon single crystal substrate, and the silicon single crystal substrate is mounted on the spot face of the susceptor during the vapor phase epitaxy step, and
   the hydrogen heat treatment step is performed at a temperature lower than a vapor phase epitaxy temperature of the silicon epitaxial layer step.

2. The method for producing the silicon epitaxial wafer as claimed in claim 1, wherein in the hydrogen heat treatment step, a temperature within the reactor when the silicon single crystal substrate is separated from the susceptor is at least 900° C.

3. The method for producing the silicon epitaxial wafer as claimed in claim 1, further comprising a cleaning step of cleaning the silicon single crystal substrate before the hydrogen heat treatment step,
   wherein the cleaning step has natural oxide film removal cleaning for removing a natural oxide film formed at least on a rear main surface of the silicon single crystal substrate, and the natural oxide film removal cleaning is performed as final cleaning of the rear main surface.

4. The method for producing the silicon epitaxial wafer as claimed in claim 3, wherein in the natural oxide film removal cleaning, the natural oxide film is cleaned and removed using hydrofluoric acid.

5. The method for producing the silicon epitaxial wafer as claimed in claim 4, wherein the cleaning step has front main surface oxide film formation cleaning for forming an oxide film on a front main surface of the silicon single crystal substrate, and the front main surface oxide film formation cleaning is performed as final cleaning of the front main surface.

6. The method for producing the silicon epitaxial wafer as claimed in claim 5, wherein a time for the silicon single crystal substrate to be stored in air during the period that the substrate is fed into the reactor after the final cleaning is set within 3 days.

7. The method for producing the silicon epitaxial wafer as claimed in claim 3, wherein the cleaning step has front main surface oxide film formation cleaning for forming an oxide film on a front main surface of the silicon single crystal substrate, and the front main surface oxide film formation cleaning is performed as final cleaning of the front main surface.

8. The method for producing the silicon epitaxial wafer as claimed in claim 7, wherein a time for the silicon single crystal substrate to be stored in air during the period that the substrate is fed into the reactor after the final cleaning is set within 3 days.

9. The method for producing the silicon epitaxial wafer as claimed in claim 1, wherein the silicon single crystal wafer is a double-sided mirror silicon single crystal substrate of which both the main surfaces are subjected to a mirror polishing finish.

* * * * *